(12) United States Patent
Agnew et al.

(10) Patent No.: US 6,773,558 B2
(45) Date of Patent: Aug. 10, 2004

(54) FLUORINE GENERATOR

(75) Inventors: Stephen F. Agnew, San Diego, CA (US); Sergei Putvinski, La Jolla, CA (US)

(73) Assignee: Archimedes Technology Group, Inc., San Diego, CA (US)

( * ) Notice: Subject to any disclaimer, the term of this patent is extended or adjusted under 35 U.S.C. 154(b) by 0 days.

(21) Appl. No.: 10/272,513

(22) Filed: Oct. 15, 2002

(65) Prior Publication Data

US 2004/0069613 A1 Apr. 15, 2004

(51) Int. Cl.[7] .............................................. C23C 14/32
(52) U.S. Cl. ......................... 204/192.35; 204/298.33; 204/298.34; 204/298.37
(58) Field of Search ....................... 204/298.33, 298.34, 204/298.37, 192.35

(56) References Cited

U.S. PATENT DOCUMENTS 4,081,677 A * 3/1978 Dawson ...................... 250/290
5,693,196 A * 12/1997 Stewart et al. .............. 204/165

* cited by examiner

*Primary Examiner*—Steven Versteeg
(74) *Attorney, Agent, or Firm*—Nydegger & Associates

(57) ABSTRACT

A fluorine generator includes a vacuum chamber filled with a working gas. An r-f antenna is positioned outside the chamber across a dielectric window from a potassium fluoride (KF) source located in the chamber. The r-f antenna radiates through the window to heat the working gas and sublime the PK source to create a plasma. Crossed electric and magnetic fields in the chamber drive the heavier potassium ions in the plasma toward a collector in the chamber while confining the lighter fluorine and working gas ions for evacuation from the chamber.

20 Claims, 1 Drawing Sheet

FLUORINE GENERATOR

FIELD OF THE INVENTION

The present invention pertains generally to fluorine radical generators. More particularly, the present invention pertains to ion filters that are able to separate fluorine ions from a plasma. The present invention is particularly, but not exclusively, useful as a system for creating a plasma by sublimating a potassium fluoride source to create a plasma from which fluorine ions can be evacuated.

BACKGROUND OF THE INVENTION

Fluorine (F) is a pale greenish yellow gas. It is the most electronegative (non-metallic) of the elements and is the first of the halogens, having only one electron vacancy in its outer energy level. Chemically, fluorine is highly corrosive and is a very reactive gas. Thus, it is never found free and, accordingly, its storage and delivery are problematic and raise serious safety implications. Moreover, fluorine gas is expensive.

Despite the difficulties that are confronted during the handling and use of fluorine, fluorine radicals have been found to be very useful in many different applications. For instance, $NF_3$ has been used extensively in semiconductor applications. More specifically, $NF_3$ has been used as a feed for etching semiconductors and, more recently, for the cleanup of vacuum chambers following an etching process. Many other examples, including other types of cleanup operations, can be cited wherein fluorine gas, or a fluorine radical, is useful.

It happens that potassium (K) reacts with fluorine (F) to create a potassium fluoride salt (KF). Unlike a fluorine radical, however, potassium fluoride salt (KF) is relatively inexpensive, and is more easily handled. Further, it also happens that a potassium fluoride salt (KF) is volatized into its constituents, K and F, when heated by a plasma. The resultant fluorine can then be used for the applications referred to above.

In light of the above, it is an object of the present invention to provide a fluorine generator that can be used as an "on-demand" source of fluorine radicals. Another object of the present invention is to provide a fluorine generator that circumvents the need for implementing the safety procedures that are required for the long-term storage of fluorine. Still another object of the present invention is to provide a convenient source of relatively clean, uncontaminated fluorine. Yet another object of the present invention is to provide a fluorine generator that is simple to use, is relatively easy to manufacture, and is comparatively cost effective.

SUMMARY OF THE INVENTION

In accordance with the present invention, a fluorine generator includes a generally cylindrical shaped vacuum chamber having a first end and a second end. The chamber defines a longitudinal axis and it is filled with a working gas. For purposes of the present invention this working gas is preferably either Neon (Ne) or Nitrogen ($N_2$).

A dielectric window is located at the first end of the chamber, and a potassium fluoride (KF) source is positioned in the chamber adjacent the window. Preferably, the KF source will be a flat, generally annular shaped disk made of a potassium fluoride salt. An r-f (radio frequency) antenna is positioned outside the chamber with the dielectric window located between the KF source and the r-f antenna. Further, the generator includes a generally annular shaped collector that is positioned inside the chamber between said first and second ends, and at a distance "a" from the axis.

In further detail, the generator includes a plurality of concentric electrodes that are mounted inside the chamber. Specifically, these electrodes are centered on the axis between the KF source and the second end of the chamber, and they are used to create a radially oriented electric field, $E_r$, in the chamber. Importantly, the electrodes are biased to create a parabolic profile of electric potential for the electric field, $E_r$, that can be defined as $\phi\xcancel{c}(r)=U(1-r^2/a^2)$. In this case, "U" is the voltage on the axis (which will preferably be below 200 volts) and "r" is a radial distance from the axis. Additionally, the generator includes magnetic coils that are mounted on the outside of the chamber to create an axially oriented and substantially uniform magnetic field, B, inside the chamber. Thus, the electric and magnetic fields are crossed ($E_r \times B$).

In the operation of the generator, the working gas is first introduced into the chamber. The r-f antenna is then activated to heat the working gas. This heating ionizes the working gas and, in turn, causes the KF source to sublimate. The result is the creation of a plasma in the chamber that includes potassium ions, fluorine atoms, fluorine ions and working gas ions. It is an important aspect of the present invention that the crossed electric and magnetic fields ($E_r \times B$) are controlled to drive the potassium ions on unconfined orbits toward the collector inside the chamber. Thus, the potassium ions, which have a mass weight of 39 and are therefore heavier than the ions of either the working gas or of fluorine, are separated from the plasma. Specifically, by being on unconfined orbits, the potassium ions do not exit the chamber and are, instead, collected on the collector in the chamber. On the other hand, contrary to its effect on the potassium ions, the controlled ($E_r \times B$) is established to place the fluorine ions and the working gas ions on confined orbits around the axis. Thus, these ions are directed toward the second end of the chamber. These ions are then evacuated from the chamber through its second end for the collection of the fluorine.

An important consideration for the operation of the generator of the present invention is the maintenance of a pressure of approximately 1–10 mTorr in the chamber. This is done by concerted control over the introduction of the working gas into the chamber and the evacuation of fluorine and working gas ions from the chamber. A consequence here is that the potassium ions, fluorine ions and working gas ions have respective densities in the plasma, wherein the densities of the potassium and fluorine ions are in a range of 5–20% of the density of the working gas ions.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
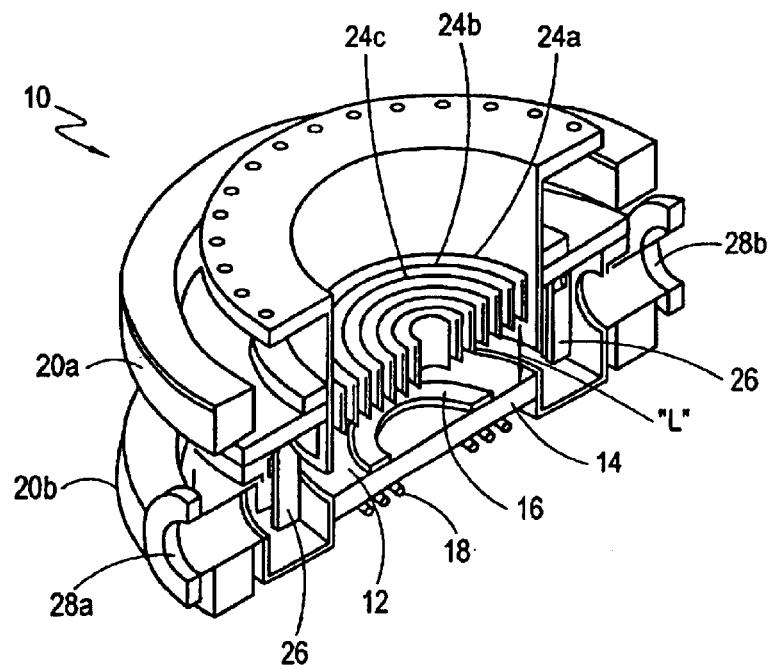
FIG. 1 is a perspective view of a fluorine generator with portions broken away for clarity.

Referring initially to FIG. 1, a fluorine generator in accordance with the present invention is shown and generally designated 10. As shown the generator 10 includes a substantially cylindrical shaped vacuum chamber 12, and a dielectric window 14 that is positioned to enclose the chamber 12 at one end. Further, generator 10 is shown to include a potassium fluoride (KF) source 16 that is located inside the chamber 12. Preferably, the KF source 16 is a flat, annular shaped disk of a potassium fluoride salt and is positioned inside the chamber 12 and near the dielectric window 14 substantially as shown. Additionally, the generator 10 is shown to include a radio frequency (r-f) antenna 18 that is positioned outside the chamber 12 and across the dielectric window 14 from the KF source 16.

Still referring to FIG. 1, it will be seen that the generator 10 also includes a plurality of magnetic coils, of which the coils 20a and 20b are exemplary. Also, it will be appreciated by the skilled artisan that permanent magnets could be used for the purposes of the present invention in lieu of the coils 20a, b. In either case, the purpose of the coils 20a, b (or permanent magnets) is to generate a constant uniform magnetic field, B, inside the chamber 12 that is substantially oriented parallel to the longitudinal axis 22 of the chamber 12 (see FIG. 2).

FIG. 1 further shows that the generator 10 includes a plurality of concentric electrodes, of which the electrodes 24a–c are exemplary. As shown, the electrodes 24a–c are centered on the axis 22 and are located at a distance "L" from the window 14. Importantly, the KF source 16 is located between the electrodes 24a–c and the window 14. The purpose of the electrodes 24a–c is to generate a radially oriented electric field, $E_r$, inside the chamber 12. Preferably this electric field E, will have a positive potential on the axis 22 that is equal to or less than approximately 200 volts, and it will have a zero potential at a radial distance "a" from the axis 22. Also, it is envisioned for the present invention that there will be a parabolic profile of electric potential for the electric field $E_r$, wherein the profile is defined as $\phi(r)=U(1-r^2/a^2)$, with "U" being the voltage on the axis 22 (e.g. 200 volts) and "r" being a radial distance from the axis 22. In any event, the consequence here is to create crossed electric and magnetic fields ($E_r \times B$) inside the chamber 12.

Figure 2:
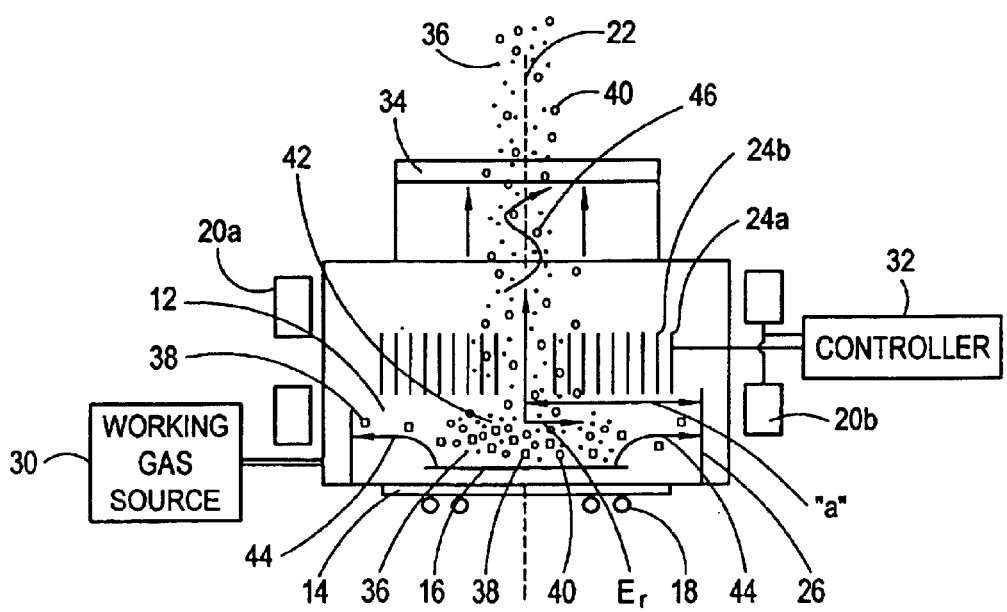
FIG. 2 is a schematic diagram of the component parts of a fluorine generator according to the present invention.

By cross referencing FIG. 1 with FIG. 2, it will be seen that a generally annular shaped collector 26 is positioned around the chamber 12 at a radial distance "a" from the axis 22. As so positioned, the collector 26 is in a plane that is substantially perpendicular to the axis 22. Further, pumping ports 28a and 28b are connected in fluid communication with the chamber 12. With specific reference to FIG. 2, it will be seen that the present invention also incorporates a working gas source 30 that is used to introduce a working gas into the chamber 12. Preferably, the working gas that is used with the generator 10 will be either Neon (Ne) or Nitrogen ($N_2$). Additionally, FIG. 2 indicates that a controller 32 is electronically connected to both the electrodes 24a–c and to the magnetic coils 20a, b. Further, FIG. 2 shows that a flow control unit 34 is provided to evacuate gases and plasmas from the chamber 12. More specifically, the flow control unit 34 is positioned at the end of chamber 12 opposite the dielectric window 14. In particular the flow control unit 34 is located so that both the KF source 16 and the electrodes 24a–c are between the dielectric window 14 and the flow control unit 34.

OPERATION

In the operation of the generator 10 of the present invention, a working gas 36 is introduced into the chamber 12 from the working gas source 30. The r-f antenna 18 is then activated to heat and vaporize the working gas 36. In turn, heat from the vapors of working gas 36 will cause the KF source 16 to sublimate and create potassium ions 38, fluorine ions 40 and fluorine atoms. The result is a multi-species plasma 42 that is held in the chamber 12.

With the plasma 42 in the chamber 12, the controller 32 is set to establish crossed electric and magnetic fields ($E_r \times B$) in the chamber 12 that will effect a predetermined cut-off mass ($M_c$). For purposes of the present invention, the cut-off mass ($M_c$) can be calculated in accordance with the disclosure of U.S. Pat. No. 6,096,220 which issued to Ohkawa for an invention entitled "Plasma Mass Filter" and which is assigned to the same assignee as the present invention. Preferably, $M_c=0.122B^2a^2/U$ for the present invention, with $M_c$ set to be less than, or approximately equal to, 39 (the mass for potassium). The result of this being, because the cut-off mass ($M_c$) can be set above the mass of the working gas 36 ($M_g$) and above the mass of fluorine, but below the mass for potassium ($M_K$) (i.e. $M_g<M_c<M_K$) the effect of the crossed electric and magnetic fields ($E_r \times B$) is predictable. Specifically, this condition will place the heavier mass potassium ions on unconfined orbits 44. Specifically, as shown in FIG. 2, the unconfined orbits 44 cause the potassium ions 38 to become collected on the collector 26. Meanwhile, the crossed electric and magnetic fields ($E_r \times B$) place the working gas ions 36 and the fluorine ions 40 on confined orbits 46 around the axis 22 in chamber 12 between the KF source 16 and the electrodes 24a–c. As indicated in FIG. 2, these confined orbits 46 cause the working gas ions 36, and the fluorine ions 40, to proceed along the axis 22 for evacuation from the chamber 12. Between the electrodes 24a–c and the flow control unit 34, the fluorine ions 40 become neutrals as they continue for evacuation from the generator 10 with the assistance of the flow control unit 34.

As the generator 10 is being operated, it is important that a pressure of approximately 1–10 mTorr be sustained in the chamber 12. This is done by concerted control over the working gas source 30 and the flow control unit 34. Specifically, this control requires that the introduction of the working gas 36 into the chamber 12 be balanced with the evacuation of fluorine ions 40 and working gas ions 36 from the chamber 12. A consequence here is that the potassium ions 38, fluorine ions 40, fluorine atoms and working gas ions 36 have respective densities in the plasma, wherein the densities of the potassium ions 38, fluorine ions 40, and fluorine atoms are in a range of 5–20% of the density of the working gas ions 36.

While the particular Fluorine Generator as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A fluorine generator which comprises:
    a chamber having a first end and a second end and defining an axis, said chamber being filled with a working gas;
    a dielectric window enclosing said first end of said chamber;
    a potassium fluoride (KF) source positioned in said chamber adjacent said window;
    an r-f (radio frequency) antenna for heating the working gas, to sublime the KF source, and create a plasma of potassium ions, fluorine ions, fluorine atoms and working gas ions in said chamber, said r-f antenna being positioned outside said chamber with said window between said KF source and said r-f antenna;

a collector positioned in said chamber between said first end and said second end at a distance "a" from the axis;

a means for generating a radially oriented electric field ($E_r$) in said chamber;

a means for generating an axially oriented magnetic field (B) in said chamber to establish crossed electric and magnetic fields ($E_r \times B$); and a means for controlling ($E_r \times B$) to drive potassium ions on unconfined orbits in said chamber to said collector for collection thereon, and to place fluorine ions and working gas ions on confined orbits around the axis inside said chamber for evacuation from said chamber through said second end thereof for collection of fluorine.

2. A generator as recited in claim 1 further comprising:

a means for introducing the working gas into said chamber, wherein the working gas is selected from a group consisting of Neon (Ne) and Nitrogen ($N_2$); and a means for evacuating fluorine ions and working gas ions from said chamber, wherein said evacuating means and said introducing means are controlled in concert to sustain the working gas at a predetermined pressure in said chamber.

3. A generator as recited in claim 2 wherein the predetermined pressure is approximately 1–10 mTorr.

4. A generator as recited in claim 1 wherein said means for generating $E_r$ is a plurality of concentric electrodes mounted in said chamber and centered on said axis between said KF source and said second end of said chamber at an axial distance "L" from said window.

5. A generator as recited in claim 4 wherein said electrodes are biased to create a parabolic profile of electric potential for $E_r$, and further wherein the profile is defined as $\phi(r)=U(1-r^2/a^2)$, with "U" being the voltage on the axis and "r" being a radial distance.

6. A generator as recited in claim 5 wherein U is less than 200 volts.

7. A generator as recited in claim 5 wherein the magnetic field is uniform and said means for generating the magnetic field is selected from a group consisting of magnetic coils and permanent magnets.

8. A generator as recited in claim 7 wherein said means for controlling ($E_r \times B$) is set to establish a cut-off mass ($M_c$) with $M_c=0.12B^2a^2/U$, and wherein ions placed on confined orbits in said chamber have a mass less than $M_c$.

9. A generator as recited in claim 8 wherein $M_c$ is less than 39.

10. A generator as recited in claim 1 wherein the potassium ions, fluorine ions, fluorine atoms and working gas ions have respective densities in the plasma, and further wherein the densities of the potassium and fluorine ions are in a range of 5–20% of the density of the working gas ions.

11. A fluorine generator which comprises:

a means for positioning a potassium fluoride (KF) source in a vacuum chamber, said chamber defining an axis;

a means for filling said vacuum chamber with a working gas;

a means for heating the working gas to sublime the KF source and create a plasma of potassium ions, fluorine ions, fluorine atoms and working gas ions in said chamber;

a means for crossing a radially oriented electric field with an axially oriented magnetic field ($E_r \times B$) in said chamber;

a means for controlling ($E_r \times B$) to drive potassium ions on unconfined orbits in said chamber to a collector mounted in said chamber for collection thereon, and to place fluorine ions and working gas ions on confined orbits around the axis inside said chamber; and a means for evacuating fluorine from said chamber substantially along the axis thereof.

12. A generator as recited in claim 11 wherein said chamber has a first end and a second end and said means for heating comprises:

a dielectric window enclosing said first end of said chamber; and an r-f (radio frequency) antenna positioned outside said chamber, with said window between said KF source and said r-f antenna, to radiate r-f energy into said chamber through said dielectric window.

13. A generator as recited in claim 12 further comprising:

a collector positioned in said chamber between said first end and said second end at a distance "a" from the axis; and a means for sustaining a predetermined pressure for the working gas in the chamber by concerted control of said filling means and said evacuating means.

14. A generator as recited in claim 13 wherein said means for crossing ($E_r \times B$) comprises:

a plurality of concentric electrodes mounted inside said chamber and centered on the axis between said KF source and said second end of said chamber at an axial distance "L" from said window for generating the electric field $E_r$; and a plurality of magnetic coils mounted outside said chamber for generating the magnetic field B.

15. A generator as recited in claim 14 wherein said electrodes are biased to create a parabolic profile of electric potential for $E_r$ defined as $\phi(r)=U(1-r^2/a^2)$, with "U" being the voltage on the axis and "r" being a radial distance, wherein the magnetic coils are activated to generate the magnetic field B, and wherein said generator further comprises a means for establishing a cut-off mass ($M_c$), with $M_c=0.12B^2a^2/U$, to place ions having a mass less than $M_c$ on confined orbits inside said chamber.

16. A method for generating fluorine which comprises the steps of:

positioning a potassium fluoride (KF) source in a vacuum chamber, said chamber defining an axis;

filling said vacuum chamber with a working gas;

heating the working gas to sublime the KF source and create a plasma of potassium ions, fluorine ions, fluorine atoms and working gas ions in said chamber;

crossing a radially oriented electric field with an axially oriented magnetic field ($E_r \times B$) in said chamber;

controlling ($E_r \times B$) to drive potassium ions on unconfined orbits in said chamber to a collector mounted in said chamber for collection thereon, and to place fluorine ions and working gas ions on confined orbits around the axis inside said chamber; and evacuating fluorine from said chamber substantially along the axis thereof.

17. A method as recited in claim 16 wherein said chamber has a first end and a second end and said heating step comprises the steps of:

providing a dielectric window for enclosing said first end of said chamber; and activating an r-f (radio frequency) antenna positioned outside said chamber, with said window between said KF source and said r-f antenna, to radiate r-f energy into said chamber through said dielectric window.

18. A method as recited in claim 17 further comprising the steps of:

mounting a collector inside the chamber, between the first end and the second end thereof, at a distance "a" from the axis; and sustaining a predetermined pressure for the working gas in the chamber by concerted control of filling during said filling step and evacuating during said evacuating step.

19. A method as recited in claim 18 wherein said crossing step comprises the steps of:

mounting a plurality of concentric electrodes inside said chamber and centered on the axis between the KF source and the second end of the chamber at an axial distance "L" from the window for generating the electric field $E_r$, with a parabolic profile of electric potential defined as $\phi(r)=U(1-r^2/a^2)$, with "U" being the voltage on the axis and "r" being a radial distance; and mounting a plurality of magnetic coils outside said chamber for generating a substantially uniform magnetic field B.

20. A method as recited in claim 19 wherein said controlling step is accomplished by establishing a cut-off mass $(M_c)$ with $M_c=0.12B^2a^2/U$, and wherein ions placed on confined orbits in said chamber have a mass less than $M_c$.

* * * * *

UNITED STATES PATENT AND TRADEMARK OFFICE
CERTIFICATE OF CORRECTION

PATENT NO. : 6,773,558 B2
DATED : August 10, 2004
INVENTOR(S) : Stephen F. Agnew and Sergei Putvinski It is certified that error appears in the above-identified patent and that said Letters Patent is hereby corrected as shown below:

Column 2,
Line 12, delete "$\phi\cent(r) = U(1-r^2/a^2).$" insert -- $\phi(r) = U(1-r^2/a^2).$ --

Column 4,
Line 14, delete "$M_c = 0.122B^2a^2/U$" insert -- $M_c = 0.12B^2a^2/U$ --

Signed and Sealed this

Twenty-first Day of December, 2004

JON W. DUDAS
*Director of the United States Patent and Trademark Office*